US012633921B2

(12) United States Patent
Sharma et al.

(10) Patent No.: US 12,633,921 B2
(45) Date of Patent: May 19, 2026

(54) DOMINO LOGIC CIRCUITRY WITH KEEPER TRANSISTORS ON BACKSIDE OF INTEGRATED CIRCUIT DIE

(71) Applicant: Intel Corporation, Santa Clara, CA (US)

(72) Inventors: Abhishek Anil Sharma, Portland, OR (US); Wilfred Gomes, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 219 days.

(21) Appl. No.: 17/711,901

(22) Filed: Apr. 1, 2022

(65) Prior Publication Data

US 2023/0318603 A1     Oct. 5, 2023

(51) Int. Cl.
| | |
|---|---|
| *H03K 19/003* | (2006.01) |
| *H01L 23/44* | (2006.01) |
| *H01L 23/522* | (2006.01) |
| *H01L 23/528* | (2006.01) |
| *H10D 30/67* | (2025.01) |
| *H10D 84/01* | (2026.01) |
| *H10D 84/03* | (2025.01) |
| *H10D 84/85* | (2025.01) |
| *H10W 20/41* | (2026.01) |
| *H10W 40/30* | (2026.01) |
| *H10D 62/10* | (2025.01) |
| *H10W 20/42* | (2026.01) |

(52) U.S. Cl.
CPC . *H03K 19/00361* (2013.01); *H03K 19/00384* (2013.01); *H10D 30/6735* (2025.01); *H10D 84/0186* (2025.01); *H10D 84/038* (2025.01);

*H10D 84/85* (2025.01); *H10W 20/427* (2026.01); *H10W 20/435* (2026.01); *H10W 40/305* (2026.01); *H10D 62/118* (2025.01); *H10W 20/42* (2026.01)

(58) Field of Classification Search
CPC .... H10D 30/6735; H10D 84/85; H10D 88/00; H01L 23/5226
See application file for complete search history.

(56) References Cited

U.S. PATENT DOCUMENTS

| | | | |
|---|---|---|---|
| 2018/0175034 A1* | 6/2018 | Goktepeli | ......... H01L 21/76898 |
| 2022/0223496 A1* | 7/2022 | Chanemougame | ......................... H10D 30/6757 |

OTHER PUBLICATIONS

Kajal, Vijay Kumar Sharma, An efficient low power method for FinFET domino or logic circuit, Microprocessors and Microsystems, vol. 95, (Year: 2022).*

(Continued)

*Primary Examiner* — Davienne N Monbleau
*Assistant Examiner* — Emily Farmer
(74) *Attorney, Agent, or Firm* — Essential Patents Group, LLP

(57) ABSTRACT

Integrated circuit (IC) including domino logic circuit blocks with nFETs that are implemented in a first device layer and pFET keeper transistors that are implemented in a second device layer. The multiple device layers may be integrated within an IC die through layer transfer. Very low temperature operation (e.g., −25° C., or less) may greatly reduce electrical leakage current from dynamic nodes of the domino logic circuit blocks so that output capacitance of the keeper transistors is sufficient to maintain dynamic node charge levels for good noise margin.

6 Claims, 11 Drawing Sheets

(56)  References Cited

OTHER PUBLICATIONS

J. P. Kulkarni et al., "5.6 Mb/mm $\wedge\{2\}$ 1R1W 8T SRAM Arrays Operating Down to 560 mV Utilizing Small-Signal Sensing With Charge Shared Bitline and Asymmetric Sense Amplifier in 14 nm FinFET CMOS Technology," in IEEE Journal of Solid-State Circuits, vol. 52, No. 1, pp. 229-239, Jan. 2017 (Year: 2017).*

Clark, William F., et al. "Low temperature CMOS—a brief review." IEEE Transactions on Components Hybrids and Manufacturing Technology 15.3 (1992): 397-404. (Year: 1992).*

Angeline, A., et al., "Domino Logic Keeper Circuit Design Techniques: A Review", J. Inst. Eng. India Ser. B; https://doi.org/10.1007/s40031-021-00668-5 (2021).

Kulkarni, et al., "5.6 Mb/mm2 1R1W 8T SRAM Arrays Operating Down to 560 mV Utilizing Small-Signal Sensing With Charge Shared Bitline and Asymmetric Sense Amplifier in 14 nm FinFET CMOS Technology", IEEE Journal of Solid State Circuits, vol. 52, No. 1, Jan. 2017.

Kursun, Volkan, et al., "Domino Logic With Variable Threshold Voltage Keeper", IEEE Transactions on Very Large Scale Integration (VLSI) Systems, vol. 11, No. 6, Dec. 2003, 14 pgs.

Paul, Rajesh Kumar, et al., "Analysis of Various Domino Logic Designs for Low Power Consumption, Noise Immunity and High Speed Performance", International Journal of Research Culture Society, vol. 2, Issue 3, Mar. 2018, 8 pgs.

Sharma, Shilpa, et al., "Energy Efficient and High Speed Domino Logic Circuit Design Techniques: An Overview", International Journal of Engineering Research and General Science vol. 3, Issue 3, May-Jun. 2015, 4 pgs.

* cited by examiner

1105

700

1192

990

M12

M11

M10

M9

M8

M7

M6

M5

M4/V3

M3/V2

M2/V1

M1

V0

M0

C1

C0

550

450

650

BM0

BM1

BM2

BM3

850

401

1100

DOMINO LOGIC CIRCUITRY WITH KEEPER TRANSISTORS ON BACKSIDE OF INTEGRATED CIRCUIT DIE

BACKGROUND

Integrated circuit (IC) devices comprising metal-oxide-semiconductor field effect transistors (MOSFETs) can implement static logic and dynamic logic. In static logic, there always a low impedance path between the output of a combinatorial circuit and either supply voltage ($V_{dd}$) or ground ($V_{SS}$) to drive the output to either a high logic state (e.g., 1) or low logic state (e.g., 0). Dynamic logic lacks such a mechanism to directly drive the output high or low. Instead, an output is typically evaluated to be high or low during distinct parts of a clock cycle. One of the advantages of dynamic logic is that because a precharge time interval of a clock cycle sets a high logic state, the evaluation time interval of the clock cycle can be rapidly implemented exclusively with nFET logic gates, which are generally significantly faster than pFET logic gates.

However, dynamic logic requires a clock rate sufficient that the output state of each dynamic gate is evaluated or refreshed before output charge capacitance of a dynamic node leaks when not driven to the point of altering the digital state of the output, which is referred to as noise margin. Cascading many such dynamic logic circuit stages can result in a circuit with insufficient noise margin.

Dynamic logic circuit blocks can be made more robust when implemented as domino logic where a keeper transistor is employed at each stage. Similar to a line of dominoes falling sequentially, the evaluation of each stage enables the next stage evaluation, and once evaluated, each stage cannot return to logic high state until another precharge phase of the next clock cycle. Depending on how keeper transistors are implemented, domino logic can suffer from lower logic circuit density.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
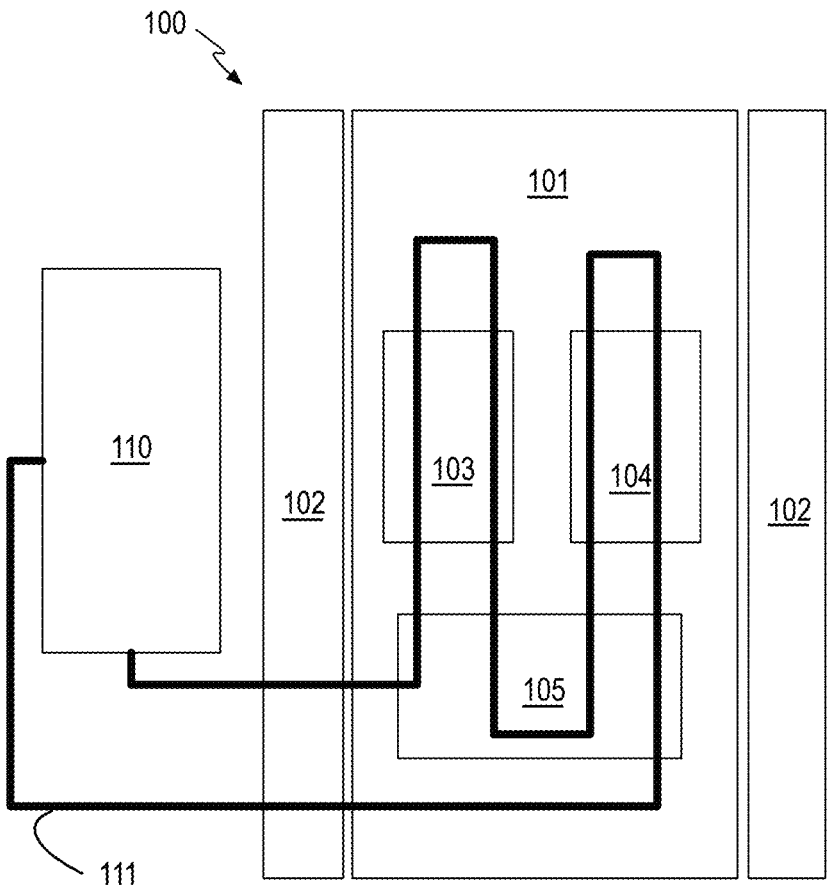
FIG. 1 illustrates a schematic of functional blocks in a microprocessor, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

FIG. 1 illustrates a schematic of functional blocks in a (micro)processor IC 100, in accordance with some embodiments. Processor IC 100 includes a core 101, which further includes shift registers 103, arithmetic logic unit (ALU) 104 and a first level (L1) cache 105. Processor IC 100 further includes a higher-level cache 102, external of core 101. Depending on implementation, higher-level cache 102 may be either an L2 cache, or an L3 cache if core 101 further comprises an L2 cache.

The logic circuitry in core 101 (e.g., shift registers 103 and ALU 104) is implemented with metal-oxide-semiconductor transistors (MOSFETs). In some examples, the logic circuitry of core 101 comprises complementary MOS (CMOS) that includes PMOS FETs (pFETs) and NMOS FETs (nFETs). More advantageously, the logic circuitry of core 101 comprises predominantly nFETs as their significantly higher switching speeds can enable faster processing speeds. In some particularly advantageous embodiments, the logic circuitry of core 101 comprises primarily nFETs that are implemented within a first device layer of an IC die with substantially all pFETs implemented within a second device layer that is integrated into a backside of the IC die. As further described below, this second device layer may be transferred from a donor substrate so that the nFETs are spared one or more thermal cycles required in the fabrication of the pFETs.

As further described below, the logic circuit blocks of core 101 include dynamic logic circuit blocks, and more particularly domino logic circuit block with keeper transistors coupled to one or more dynamic circuit nodes. In accordance with embodiments herein, the keeper transistors are implemented with pFETs in the second (i.e., backside) device layer of an IC die. Dynamic circuitry in core 101 may, for example, include pFET keeper transistors that couple dynamic nodes to a power supply rail that is routed to the keeper transistors through backside metallization.

In accordance with exemplary embodiments, processor IC 100 is actively cooled. Active cooling uses power to provide cooling either directly (e.g., thermoelectric device) or indirectly (e.g., with a chiller 110 coupled through a coolant loop 111). During operation of processor IC 100, the active cooling is to maintain at least some portion of IC 100 at a very low temperature, for example at least below 0° C., advantageously below −50° C., and more advantageously within the cryogenic temperature range (e.g., <−70 C).

Although workload variation may result in thermal transients within the logic circuitry of core 101, a majority of processor IC 100 may nevertheless be maintained at very low temperatures during a majority of its operational lifetime. Accordingly, the MOS transistors in IC 100, particularly the nFET structures, can sustain a substantial boost in performance relative to their performance at higher (e.g., >>0° C.) temperatures. During very low temperature operation, MOS transistors display increased carrier (e.g., electron) mobility leading to substantially higher drive currents. Very low temperature (e.g., cryogenic) operation also significantly reduces transistor leakage currents, significantly improving the noise margin of domino logic circuits and reducing the charge supply keeper transistors must provide for a given noise margin.

Figure 2:
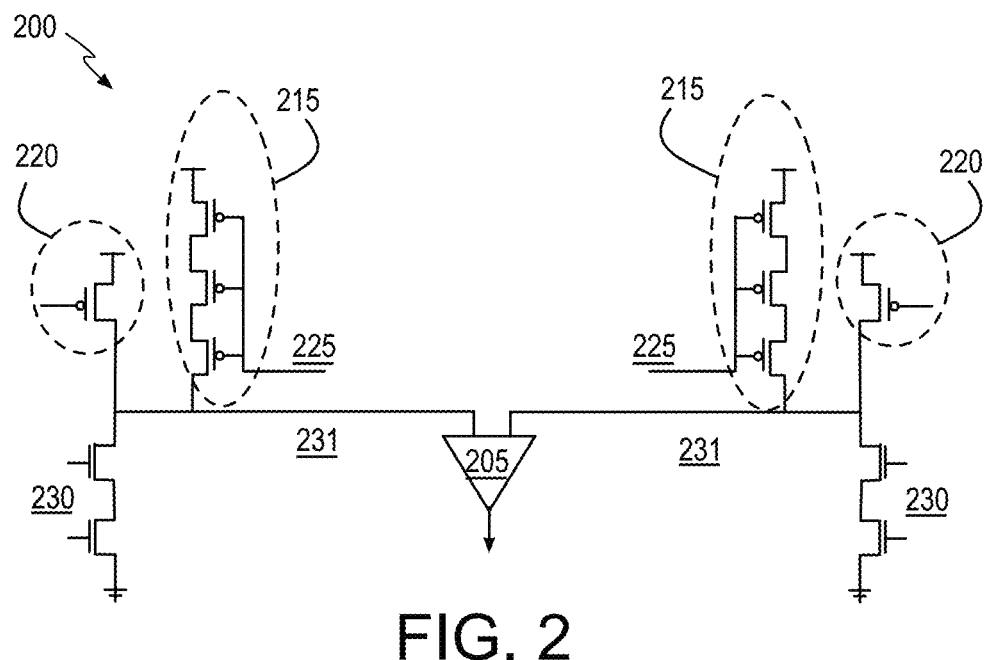
FIG. 2 is a circuit diagram of an exemplary dynamic logic circuit block suitable for sensing bit-cell values in a memory array, accordance with some embodiments.

FIG. 2 is a circuit diagram of an exemplary dynamic logic circuit block 200 suitable for small signal sensing of bit-cell values in a memory array, accordance with some embodiments. Circuit block 200 is an example of domino logic for sensing bit-cell values within an SRAM array, such as L1 cache 105 (FIG. 1). In circuit block 200, read disturb can be reduced using a non-interleaved column design with single-ended read ports 230 in a full swing bitline architecture where each read port 230 is coupled to a sense amplifier (SA) 205 through a read bitline 231 that is representative of a dynamic circuit node. Loss of noise margin attributable to leakage at this dynamic node (e.g., from an inactive one of read ports 230) can be reduced through the very low temperature operation of circuit block 200.

For each of read bitline 231, sense amplifier SA 205 includes differential pull-down branches comprising nFETs. In exemplary embodiments, these nFETs are implemented in a first device layer of an IC die. This first device layer comprises predominantly nFETs, which may be implemented at a greatest possible transistor density, or smallest pitch. The first device layer may further comprise some minority number of pFETs (i.e., a CMOS device layer) or it may be exclusively nFETs (i.e., an NMOS device layer). A read bitline 231 is precharged (e.g., to $V_{dd}/V_{cc}$) by pFETs 220 with the precharge maintained by one or more pFET bitline keeper transistors 215. In exemplary embodiments, keeper transistors 215 are implemented within a second device layer of an IC die. This second device layer may comprise exclusively pFETs having a lower transistor density, larger pitch, than that of the nFETs of the first device layer.

For embodiments where the first device layer is a CMOS layer comprising some pFETs, the second device layer may comprise exclusively keeper transistors. The second device layer may then implement pFETs that all have weaker drive (e.g., higher threshold voltage, smaller effective channel width, etc.) than any pFETs of circuit block 200 that are instead implemented in the first device layer. In other embodiments, all pFETs of circuit block 200 (including those of SA 205) are implemented within the second device layer, while all nFETs of circuit block 200 (including those of SA 205 others associated with each of read ports 230) are implemented within the first device layer. Such separation of the CMOS across two device layers is referred to herein as "heterogeneous domino circuitry," and may enable a rapid design-in of keeper transistors between arbitrary nodes of a logic circuit and a supply voltage rail (e.g., $V_{cc}/V_{dd}$) to implement domino logic. Separation of the CMOS across two device layers may also improve the density of circuit block 200, for example with the more numerous nFETs all arranged within a minimum pitched array while the fewer pFETs are spatially arranged less densely in a device layer as needed to interface with the nFETs. Heterogeneous domino circuitry may also improve nMOS transistor performance, for example because the nFETs may not be subjected to thermal cycles associated with fabrication of the pFETs.

As further illustrated in FIG. 2, keeper transistors 215 are coupled to a keeper gate control 225. Keeper gate control 225 may be simply coupled to ground, for example, so that keeper transistors 215 stack up to supply predetermined voltage dropped from $V_{dd}$ according to their threshold voltages. However, since reading a high logic level (1) involves contention between pull-down paths within SA 205, keeper transistors 215 then need to be sized and/or their threshold voltage tuned relative to the nFET pull-down paths to balance the read-1 evaluation with the read of a low logic level (0).

In accordance with some advantageous embodiments, keeper gate control 225 is coupled to a dynamic or transient small signal source that switches keeper transistors 215 from off to on states and back to off within one clock cycle. For such embodiments, contention between the pull-down paths within SA 205 and keeper transistors 215 can be greatly reduced. However, charge retention at the dynamic node (e.g., read bitlines 231) may then be limited to only the on-state duration of keeper transistors 215 and the output capacitance associated with the drain-source capacitance ($C_{ds}$) and gate-drain capacitance ($C_{gs}$) of keeper transistors 215, which will remain on the dynamic node when keeper gate control 225 is turned off. After keeper transistors 215 turn off, their output capacitance can maintain the dynamic node charge for a finite time, which is extended by very low temperature operation because although leakage from the dynamic node is greatly reduced, output capacitance of keeper transistors 215 is essentially independent of temperature. With sufficiently low dynamic node leakage, precharge and evaluation intervals need such low energy that keeper transistor(s) output capacitance can be sufficient to supply the dynamic node with current and provide noise immunity to a domino stage. The ability for dynamic keeper transistors 215 to charge buffer a domino stage controlled through small signal gate-controlled switching capacitance therefore improves as the operating temperature of the domino circuit declines into the cryogenic regime. In some advantageous embodiments, the small signal gate control 225 turns on keeper transistors 215 only during a precharge interval so that dynamic node potential during the evaluation interval is maintained by the output capacitance of keeper transistors 215 (along with any other capacitances stored to the dynamic node).

Although circuit block 200 illustrates the application of keeper transistors in an exemplary domino circuit, there are many domino circuit topologies which may be implemented in the manner described above. For example, any of footed domino logic (FDL), conditional keeper logic (CKL), conditional evaluation domino logic (CEDL), high speed domino logic (HSDL) or high-speed clock-delay (HSCD) may be implemented with at least the keeper transistors within a second device layer comprising pFETs, in accordance with embodiments herein. The various domino circuit topologies may also be applied to a wide variety of function circuit blocks other than the bit-cell sense amp illustrated in FIG. 2.

Figure 3:
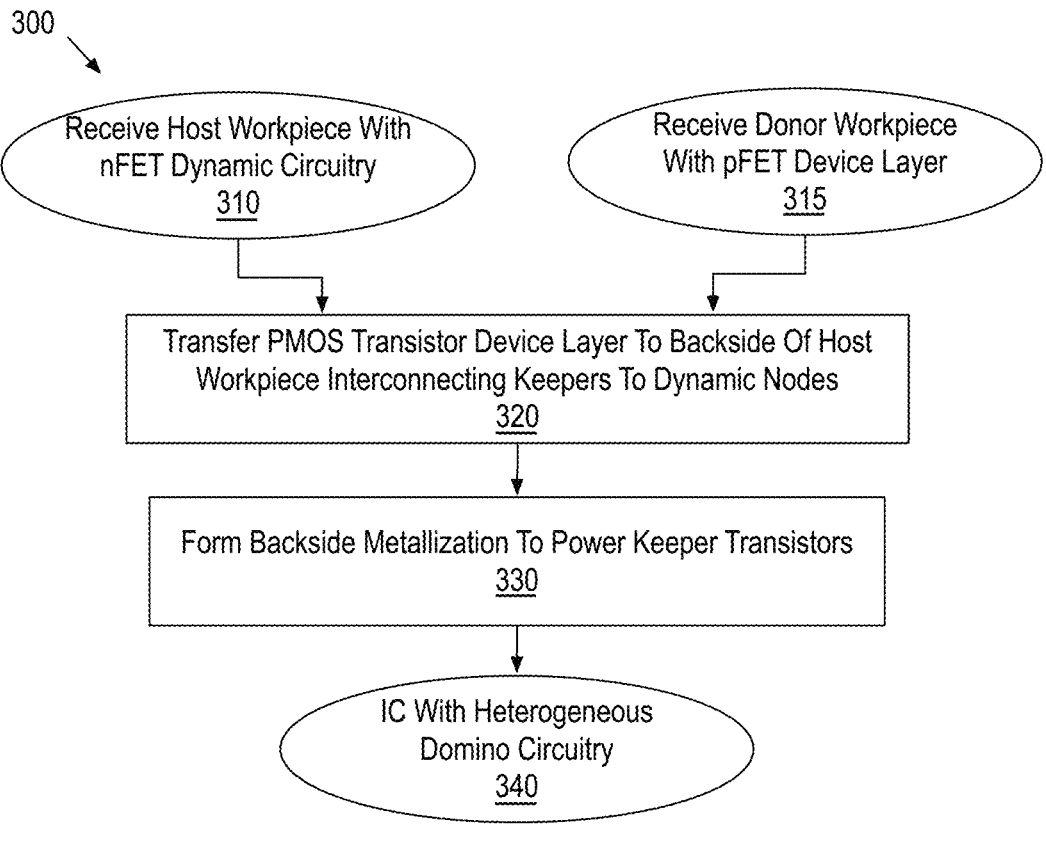
FIG. 3 is a flow diagram of methods for fabricating an IC die with dynamic logic circuitry blocks comprising keeper transistors on a backside of the IC die, in accordance with some embodiments.

FIG. 3 is a flow diagram of methods 300 for fabricating an IC die with dynamic logic circuitry comprising keeper transistors on a backside of the IC die, in accordance with some embodiments. Methods 300 begin at input 310 with receipt of a host workpiece comprising dynamic logic circuitry comprising nFET structures. The host workpiece may be any large format semiconductor wafer (e.g., a monocrystalline semiconductor material) with a device layer comprising the NFET structures with one or more overlying interconnect metallization layers coupling the NFET structures into a circuit block having one or more dynamic nodes. At input 310, the dynamic logic circuit block may not yet include any keeper transistors coupled to the dynamic nodes. In further embodiments, the dynamic logic circuitry on the workpiece received at input 310 is exclusively nMOS, lacking any pFET structures.

A donor workpiece is similarly received at secondary input 315. The donor workpiece may also be a large format semiconductor wafer (e.g., a monocrystalline semiconductor material) with another device layer comprising FET structures. The donor device layer comprises predominantly pFET structures and advantageously includes only pFET structures (no nFET structures). Methods 300 continue at block 320 where the donor device layer is separated from the donor workpiece and transferred to a backside of the host workpiece. Any layer transfer process known in the art may be practiced at block 320. For example, a wafer-level bonding process may be practiced to join the donor device layer to the backside of the host workpiece. Following the layer transfer, various ones of the pFET structures are interconnected to dynamic nodes of the dynamic circuitry as keeper transistors. Such interconnection may be through metallization features formed in one or more of the host workpiece or donor device layer.

At block 330, one or more backside interconnect metallization layers coupled to the pFET structures are fabricated during backside processing of the host workpiece. The backside interconnect metallization layers are to at least provide a voltage rail to the various keeper transistors within the donor device layer. Methods 300 then end at output 340 where the IC die comprising heterogeneous domino circuitry is completed with any fabrication and/or packaging processes known in the art.

Figures 4A, 4B:
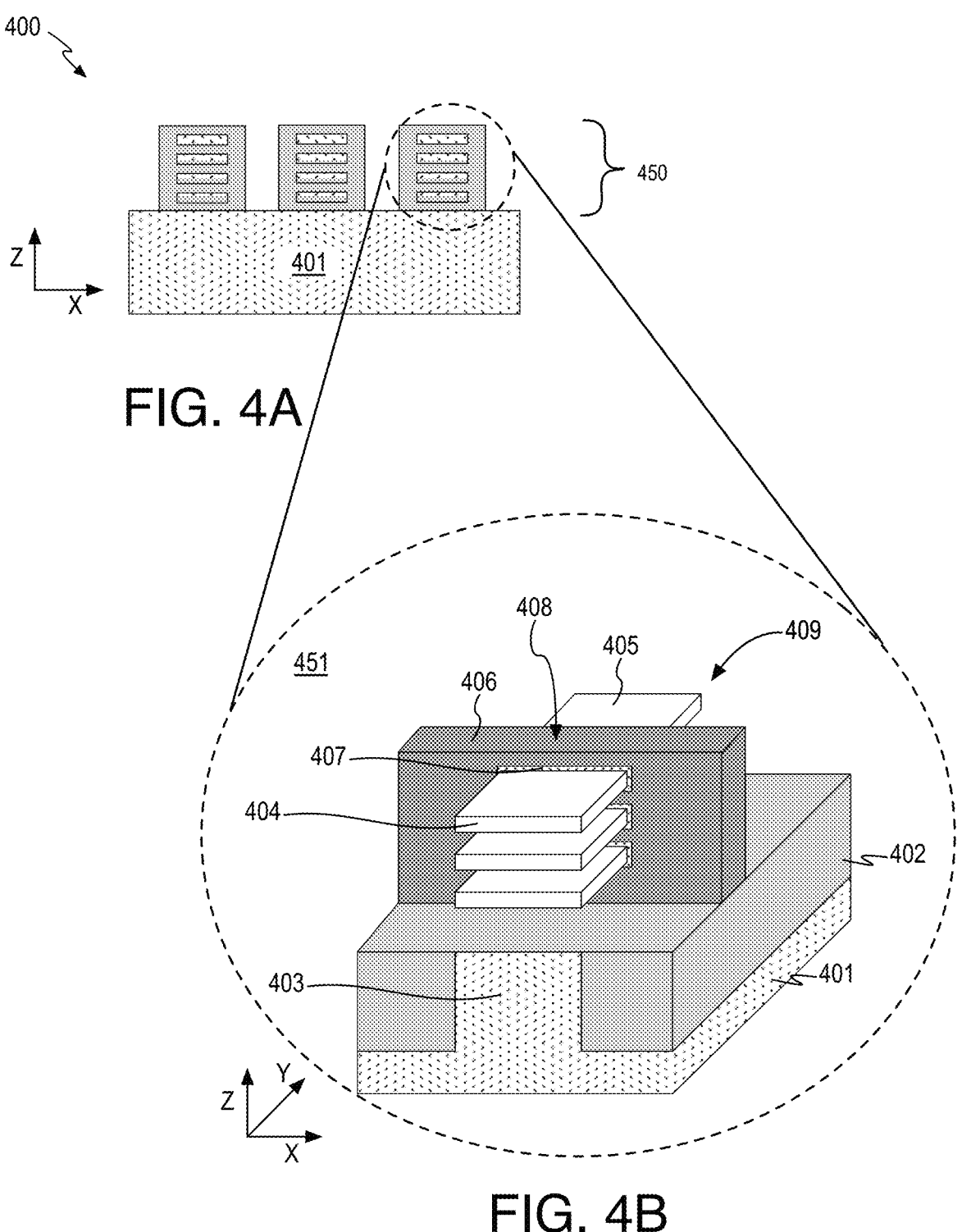
FIGS. 4A and 4B illustrate cross-sectional and isometric views of nanosheet FET structures, in accordance with some embodiments.

The nFET and pFET structures implementing heterogenous domino circuitry are advantageously non-planar FETs, such as Fin FETs or gate all around (GAA) FETs. GAA FET structure may also be referred to as nanosheet, nanoribbon, or nanowire FET structures. FIG. 4A illustrates a cross-sectional view of a portion of a host workpiece 400 including a device layer 450 comprising a plurality of nanosheet FET structures 451, in accordance with some embodiments. Device layer 450 is over first (front) side of a substrate 401. Substrate 401 may include any suitable material or materials. For example, substrate 401 may be a monocrystalline substrate substantially aligned along a predetermined crystal orientation (e.g., (100), (111), (110), or the like). In some examples, substrate 401 may include a semiconductor material such as monocrystalline silicon (Si), germanium (Ge), silicon germanium (SiGe), a III-V based material (e.g., gallium arsenide (GaAs)), a silicon carbide (SiC), a sapphire ($Al_2O_3$), or any combination thereof.

FIG. 4B illustrates an expanded isometric view of one exemplary FET structure 451 including a stack of semiconductor material nanosheets 409. Although a stacked nanosheet transistor architecture is illustrated, other FET structures, such as single-channeled finFETs, and even planar FETs, are also possible as somewhat lower performing alternative embodiments. In the Nanosheets 409 may comprise a top portion of a semiconductor material fin 403. One or more dielectric materials 402 surround fin 403. Dielectric materials 402 be of any composition such as, but not limited to, silicon dioxide, silicon nitride, silicon oxynitride, or any known low-k material having a relative permittivity below 4.0. Nanosheets 409 may be of the substantially the same semiconductor material as substrate 401, and formed using any suitable technique or techniques such as epitaxial growth, lithographic patterning, and compositionally selective etch techniques. In some embodiments, nanosheet FET structure 451 is advantageously an nFET structure in which nanosheets 409 comprise substantially pure silicon. In other embodiments, nanosheets 409 comprise an III-V alloy known to be suitable for nFET structures (e.g., InGas, InAs, etc.).

Each nanosheet FET structure 451 further includes a gate insulator 407 and a gate electrode 406, both which surround nanosheet channel regions 408 that extend between source material 404 and drain material 405. For exemplary nFET structures, source material 404 and drain material 405 are n-type semiconductor materials comprising donor impurities. Source material 404 and drain material 405 may each be a portion of nanosheets 409, as shown, or epitaxially grown from channel regions 408. Source material 404 and drain material 405 may be any semiconductor material compatible with channel semiconductor material associated with nanosheets 409, such as, but not limited to, group IV semiconductors (e.g., Si, Ge, SiGe), group III-V semiconductors (e.g., InGaAs, InAs), group III-N semiconductors (e.g., InGaN), or (metal) oxide semiconductors.

Figure 5:
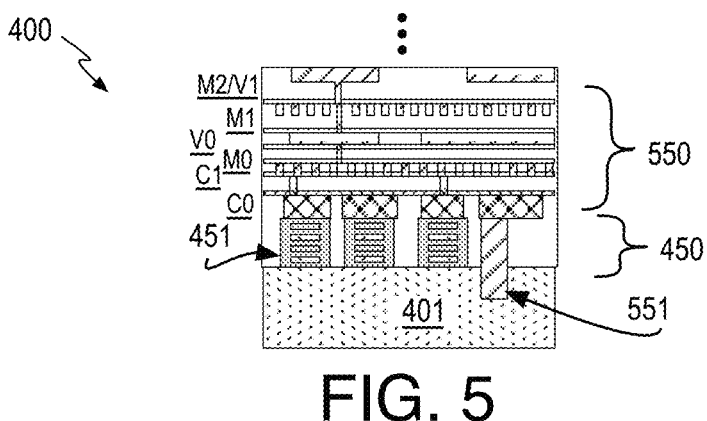
FIGS. 5, 6, 7, and 8 illustrate cross-sectional views of an IC die evolving to include dynamic logic circuitry blocks comprising keeper transistors on a backside of the IC die, in accordance with some embodiments.

FIG. 5-8 illustrate cross-sectional views of an IC die evolving to include heterogeneous domino logic circuitry comprising keeper transistors on a backside of the IC die, in accordance with some embodiments. As shown in FIG. 5, host workpiece 400 is further processed to fabricate interconnect metallization levels 550 over a front side of device layer 450. Interconnect metallization levels 550 may have any number of levels with the example including a contact zero (C0) level coupled to FET structures 451 and upper levels including additional contact/via levels (C1, V0, V1) and line levels (M0, M1, M2). Interconnect metallization levels 550 interconnect FET structures 451 into circuitry, and more particularly into circuitry having one or more dynamic node that will undergo precharge and evaluation stages during operation of the IC die. For exemplary embodiments where the FET structures 451 are predominantly nFET structures and lack any pFET keepers, the circuitry remains functionally incomplete following the fabrication of interconnect metallization levels 550. In addition to metallization levels 550 over a top/front side of device layer 450, one or more interconnect metallization features 551 may extend into substrate 401 to a depth below device layer 450.

Figure 6:
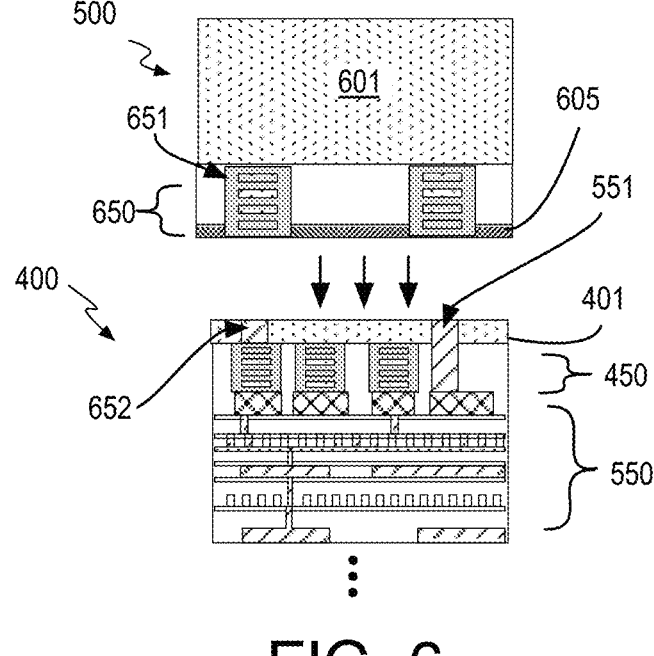

In FIG. 6, host workpiece 400 has been inverted with the back side becoming the working surface. In this example, substrate 401 is etched, cleaved, and/or polished down. The thinning of substrate 401 is sufficient to expose interconnect metallization features 551. After thinning, additional backside processing may be performed on host workpiece 400, for example to form additional interconnect metallization features in contact with one or more FET structures within device layer 450. In the illustrated example, an interconnect metallization feature 652 is formed through a remaining thickness of substrate 401. Interconnect metallization feature 652 may land, for example, on a gate electrode or source/drain material of one or more FET structures within device layer 450. Hence, host transistor level interconnect metallization features may be fabricated either from a top/front side or a bottom/back side of the host workpiece to interconnect FET structures of two different device layers.

FIG. 6 further illustrates a donor workpiece 500 inverted during a transfer of a donor device layer 650 from a donor substrate 601 to the backside surface of host workpiece 400. In the example illustrated, donor device layer 650 includes FET structures 651, which are again illustrated to have nanosheet architecture although other non-planar and planar transistor architectures are also possible. In exemplary embodiments, FET structures 651 are substantially all pFET structures. FET structures 651 may be fabricated according to any techniques known to be suitable in the manufacture of monolithic ICs, and embodiments are not limited in this respect. In exemplary embodiments, FET structures 651 are substantially the same as FET structures 451 (e.g., as depicted in FIG. 4B) except for their complementary majority carrier conductivity type (i.e., p-type) and a more relaxed device pitch.

Donor device layer 650 may be bonded to host workpiece 400 through any means. In the illustrated example, a bonding interface layer 605 is between donor device layer 650 and substrate 401. Interface layer 605 may have a variety of chemical compositions, but in some advantageous embodiments, interface layer 605 is silicon nitride (SiN) or silicon oxynitride (SiON). In the illustrated example interface layer 605 is substantially planar with a gate electrode of FET structures 651 (having a structure substantially the same as that of the FET structures 451 depicted in FIG. 4B). A similar interface layer may be formed on host workpiece 400 to supplement interface layer 605 or in the alternative to interface layer 605. Regardless of where the interface layer is provided, the interface layer will be between FET structures 651 and substrate 401 following the bonding process. The presence of such an interface layer is therefore indicative of a layer transfer.

Figure 7:
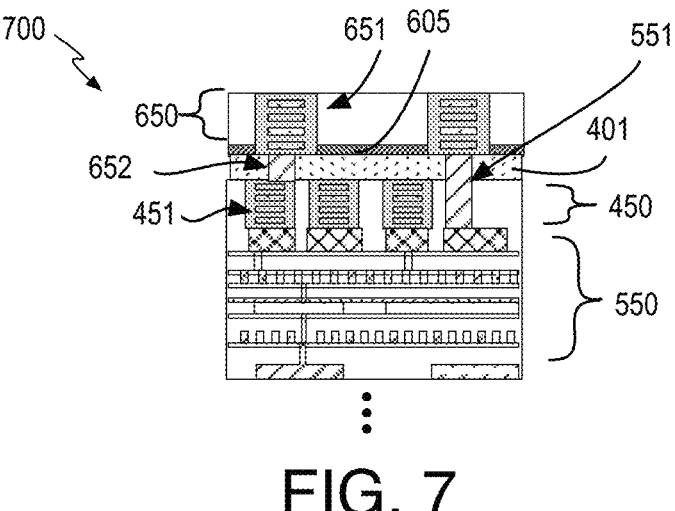

FIG. 7 further illustrates a device layer transfer following removal of donor substrate 601. The resulting heterogenous IC die 700 includes only one substrate (401) between two device layers 450 and 650. Interconnect metallization features 551 extend through substrate 401 and interconnect FET structures of device layer 650 to one or more features of metallization levels 550 on a front side of device layer 450. Interconnect metallization features 652 similarly extend through substrate 401, but directly interconnect a terminal of one or more FET structures 451 to a terminal of one or more FET structures 651. Either, or both, of interconnect metallization features 551 and 652 may interconnect FET structures 651 to dynamic nodes of circuitry otherwise implemented with FET structures 451.

Figure 8:
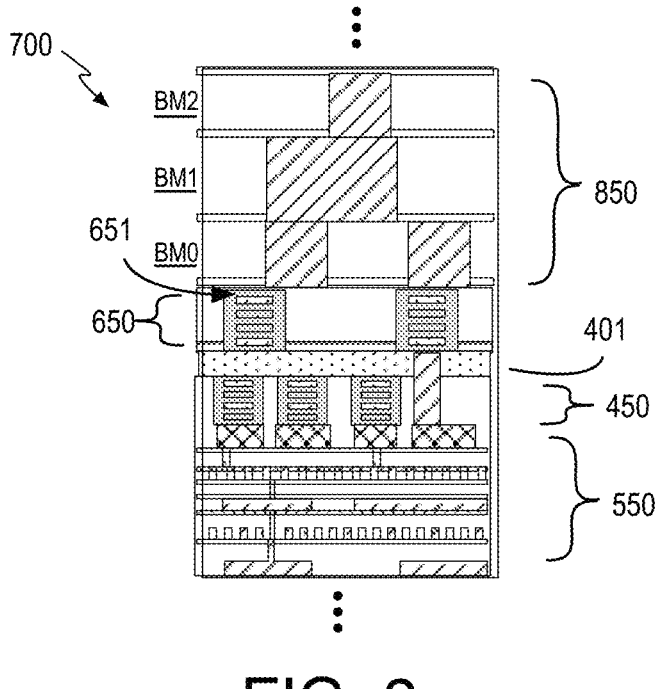

FIG. 8 further illustrates fabrication of backside interconnect metallization levels 850 on a side of donor device layer 650 opposite interconnect metallization levels 550. Interconnect metallization levels 850 may include any number of levels with the example including a backside metal zero (BM0) level coupled to FET structures 651 and upper levels (BM1 and BM2) interconnecting FET structures 651 to an uppermost metallization feature that is to further couple to a power supply that provides power to FET structures 651 during operation of IC die 700. For example, backside interconnect metallization levels 850 may provide a $V_{dd}/V_{cc}$ supply rail voltage to FET structures 651 that are interconnected as pFET keepers to dynamic nodes of circuitry block otherwise implemented with nFET structures 451.

The heterogenous IC die 700 may be integrated into any suitable computer system. For example, in some embodiments IC die 700 implements core circuitry 101 of processor IC 100 (FIG. 1). In other embodiments, IC die 700 implements only shift registers 103 and ALU 104 (FIG. 1). As previously noted, core circuitry 101 may be operated at a very low temperature, for example to ensure the pFET keepers are able to maintain charge levels at various dynamic nodes of core circuitry 101.

Figure 9:
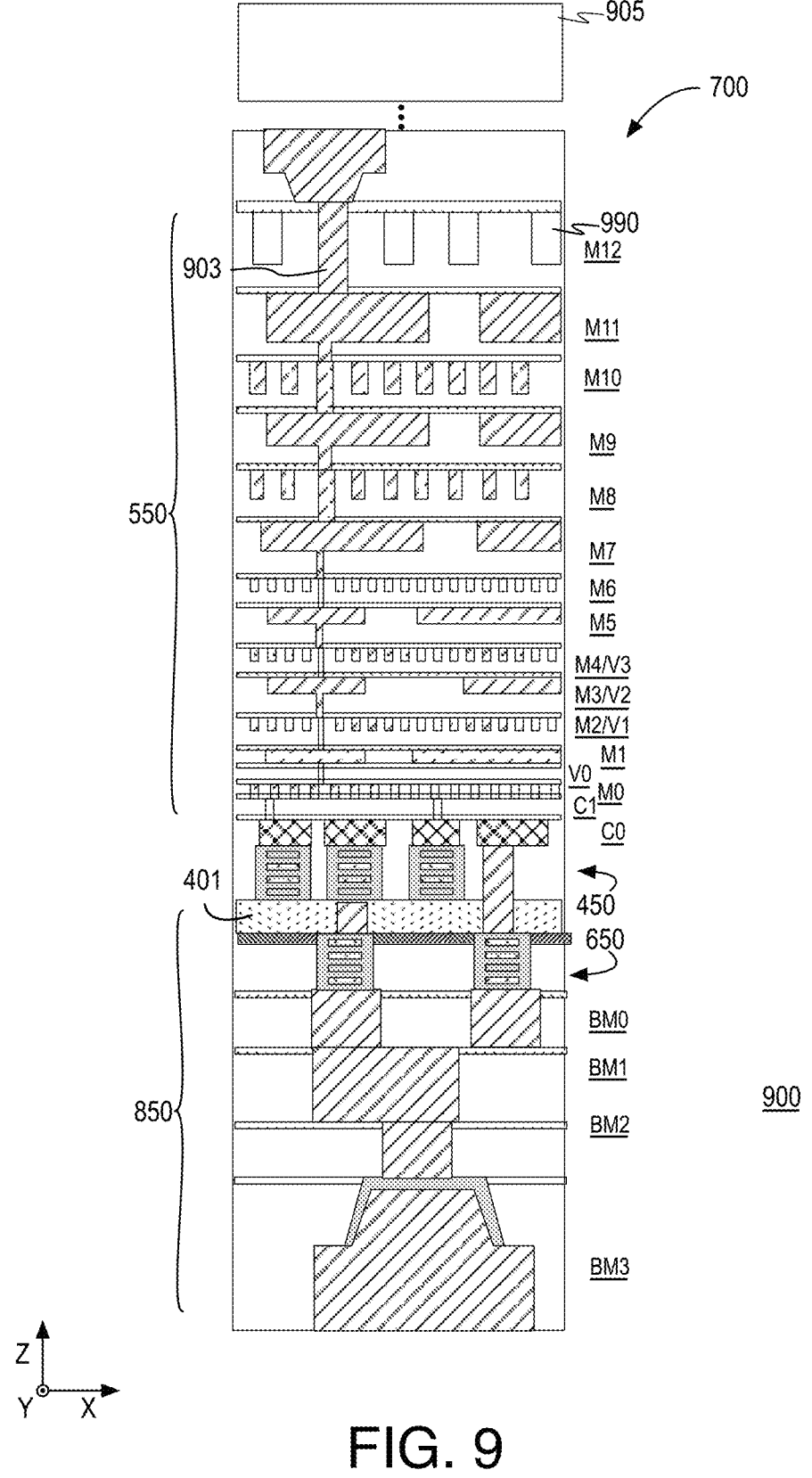
FIG. 9 illustrates a cross-sectional view of a low-temperature integrated circuit system with die-level active liquid phase cooling, in accordance with some embodiments.

FIG. 9 illustrates a cross-sectional view of a low temperature integrated circuit system 900 with die-level active liquid phase cooling, in accordance with some embodiments. In IC system 900, IC die 700 includes liquid coolant conveyance structures or components to otherwise remove heat from IC die 700 to achieve a very low operating temperature, for example at or below 50° C., for at least some transistors of IC die 700 during their operation.

In IC system 900, IC die 700 includes die level active liquid cooling as provided by microchannels 990. Microchannels 990 are to convey a heat transfer fluid to remove heat from IC die 700. The heat transfer fluid may be any suitable liquid or gas. In some embodiments, the heat transfer fluid has a cryogenic temperature operating window (e.g., about −70° C. to about −180° C.). In some embodiments, microchannels 990 are to convey liquid nitrogen operable to lower the temperature of at least a portion of IC die 700 to at or below about −70° C. In some other embodiments, the microchannels 990 are to convey one of helium-3, helium-4, hydrogen, neon, air, fluorine, argon, oxygen, or methane.

IC die 700 may include multiple microchannels 990 providing discrete channels or a network of interconnected channels. Microchannels 990 may have any pattern in the x-y plane such as a serpentine pattern, or the like. Microchannels 990 may be routed over an entirety of IC die 700 at some uniform density. Alternatively, microchannels 990 may be routed more densely over one portion of IC die 700, such as a domino logic portion of IC die 700, than another portion of IC die 700, such as a static logic portion of IC die 700. Microchannels 990 place IC die 700 in fluid communication with a heat exchanger (not shown) external to IC die 700 that removes heat from the heat transfer fluid before its re-circulation through microchannels 990. The flow of fluid within microchannels 990 may be maintained by a pump or other means to provide a pressure differential between opposite ends of microchannels 990. The operation of a heat exchanger, pump, etc. may be controlled by a controller, for example.

In the illustrated embodiment, microchannels 990 are implemented at a metallization level M12. Metallization levels M0 through M11 may accordingly comprise and metallization levels 550 over a first side of device layer 450. Maintained at potentially cryogenic temperatures, substrate leakage through FET structures within device layer 450 is much less than at standard temperature.

Microchannels 990 may be formed using any suitable technique(s), such as patterning and etch techniques to form voids followed by deposition, lamination or bonding techniques to enclose the voids. Microchannels 990 may be adjacent to a metallization feature 903, which may be an interface to a package level interconnect structure associated with a package 905. As shown in FIG. 9, backside metallization levels BM0-BM3 are over a backside of device layer 650 and may couple electrical power into at least FET structures within device layer 650, for example.

Figure 10:
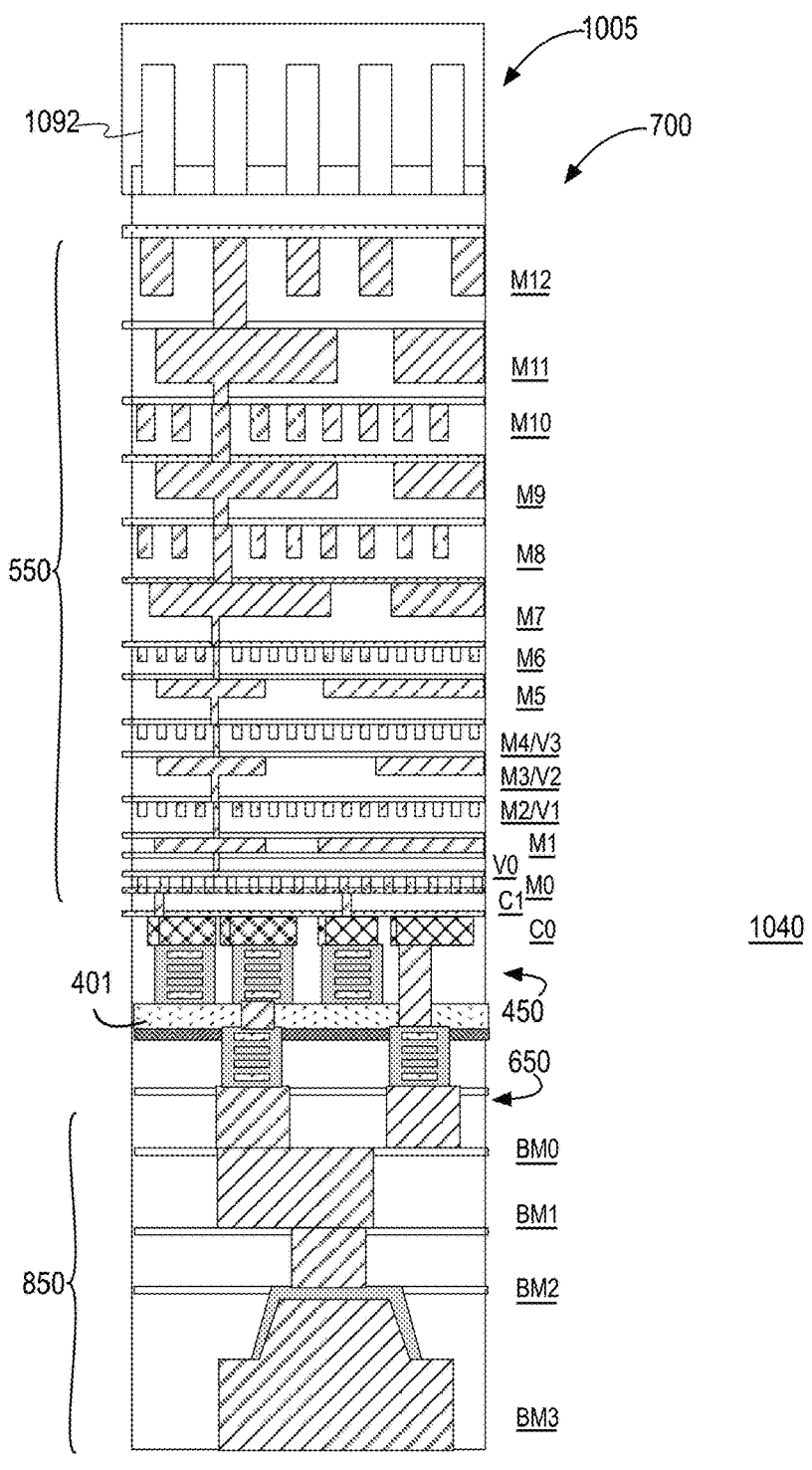
FIG. 10 illustrates a cross-sectional view of a low-temperature integrated circuit system with package-level active liquid phase cooling, in accordance with some embodiments.
Figure 10:
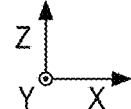

FIG. 10 illustrates a cross-sectional view of a low temperature integrated circuit system 1040 with package-level active liquid phase cooling, in accordance with some embodiments. In IC system 1040, IC die 1002 includes active cooling structures or components to remove heat from IC die 1002 to achieve a steady-state operating temperature within at least some portion of IC die 1002 at a very low temperature, such as −50° C. or any other operating temperature discussed herein.

In IC system 1040, IC die package 1005 includes a liquid cooling structure having microchannels 1092. Microchannels 1092 are to similarly convey a heat transfer fluid to remove heat from IC die 1002. The heat transfer fluid may be any of the liquid or gas examples described as suitable for microchannels 990. Microchannels 1092 are to couple to a heat exchanger (not shown) external of IC die package 1005. In the illustrated embodiment, IC die package 1005 is an active chiller that may be operable at cryogenic temperatures and mounted to IC die 1002 according to any suitable techniques, such as a bonding or solder interconnection.

Figure 11:
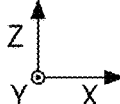
FIG. 11 illustrates a cross-sectional view of a low-temperature integrated circuit system with die-level and package-level active liquid phase cooling, in accordance with some embodiments.

FIG. 11 illustrates a cross-sectional view of a low temperature integrated circuit system 1100 having both die-level and package-level active liquid phase cooling, in accordance with embodiments. In IC system 1100, IC die 700 includes active cooling structures or components as provided by both microchannels 990 and IC die package 1105. In some embodiments, the heat transfer fluid deployed in microchannels 990 and microchannels 1192 are coupled to the same pump and heat exchanger systems. In such embodiments, the heat transfer fluid conveyed in microchannels 990 and 1192 are part of the same active cooling loop. In other embodiments, the heat transfer fluids in each of microchannels 990 and 1192 are maintained as separate active cooling loops.

Figure 12:
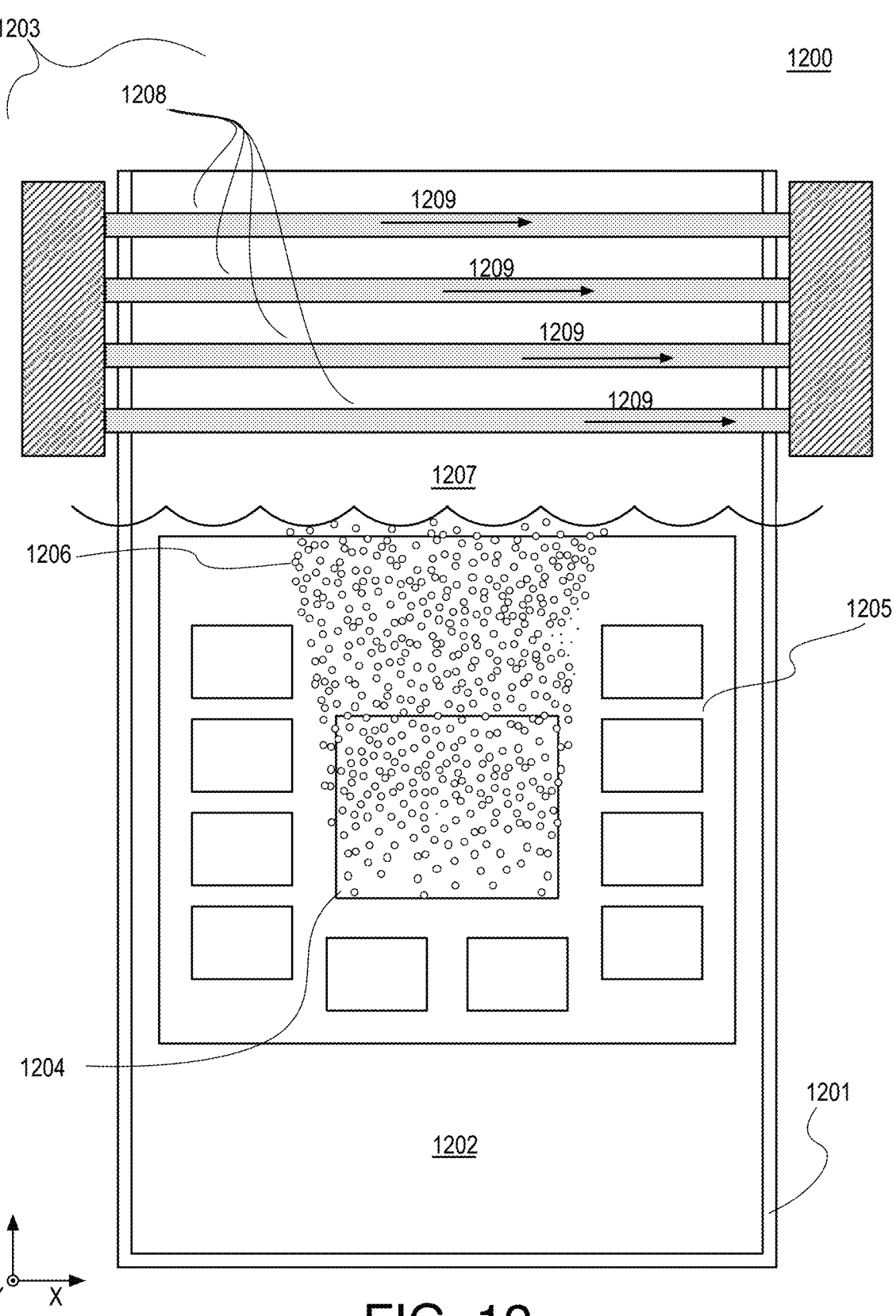
FIG. 12 illustrates a schematic of a liquid phase immersion cooling system for cryogenic operation of an integrated circuit die comprising dynamic logic circuitry with keeper transistors on a backside of the IC die, in accordance with some embodiments.

FIG. 12 illustrates a schematic of a liquid phase immersion cooling system 1200 for cryogenic operation of an integrated circuit die comprising heterogeneous domino circuitry having keeper transistors in accordance with one or more embodiments described elsewhere herein. As shown, two-phase immersion cooling system 1200 includes a fluid containment structure 1201, a low-boiling point liquid 1202 within fluid containment structure 1201, and a condensation structure 1203 at least partially within fluid containment structure 1201. As used herein, the term low-boiling point liquid indicates a liquid having a boiling point in the very low (e.g., cryogenic) temperature ranges above. In some embodiments, the low-boiling point liquid is one of nitrogen (LN2), helium-3, helium-4, hydrogen, neon, air, fluorine, argon, oxygen, or methane.

In operation, a heat source 1204 (such as an IC die including any of transistor structures 451 or 651 described above) is immersed in low-boiling point liquid 1202. In some embodiments, IC die or IC systems deployed in two-phase immersion cooling system 1200 do not include fluid microchannels. In alternative embodiments, such die-level or package-level active cooling structures may be used in concert with two-phase immersion cooling system 1200. Hence, any IC die, for example as described elsewhere herein, may be attached to a host substrate 1205. Host substrate 1205 may be coupled to a power supply (not shown) and may be partially or completely submerged in low-boiling point liquid 1202.

In operation, the heat produced by heat source 1204 vaporizes low-boiling point liquid 1202 illustrated as bubbles 1206, which may collect as a vapor portion 1207 within fluid containment structure 1201. Condensation structure 1203 may extend through vapor portion 1207. In some embodiments, condensation structure 1203 is a heat exchanger having tubes 1208 with a cooling fluid (i.e., a fluid colder than the condensation point of vapor portion 1207) flow 1209 through tubes 1208 to condense vapor portion 1207 back to low-boiling point liquid 1202.

Figure 13:
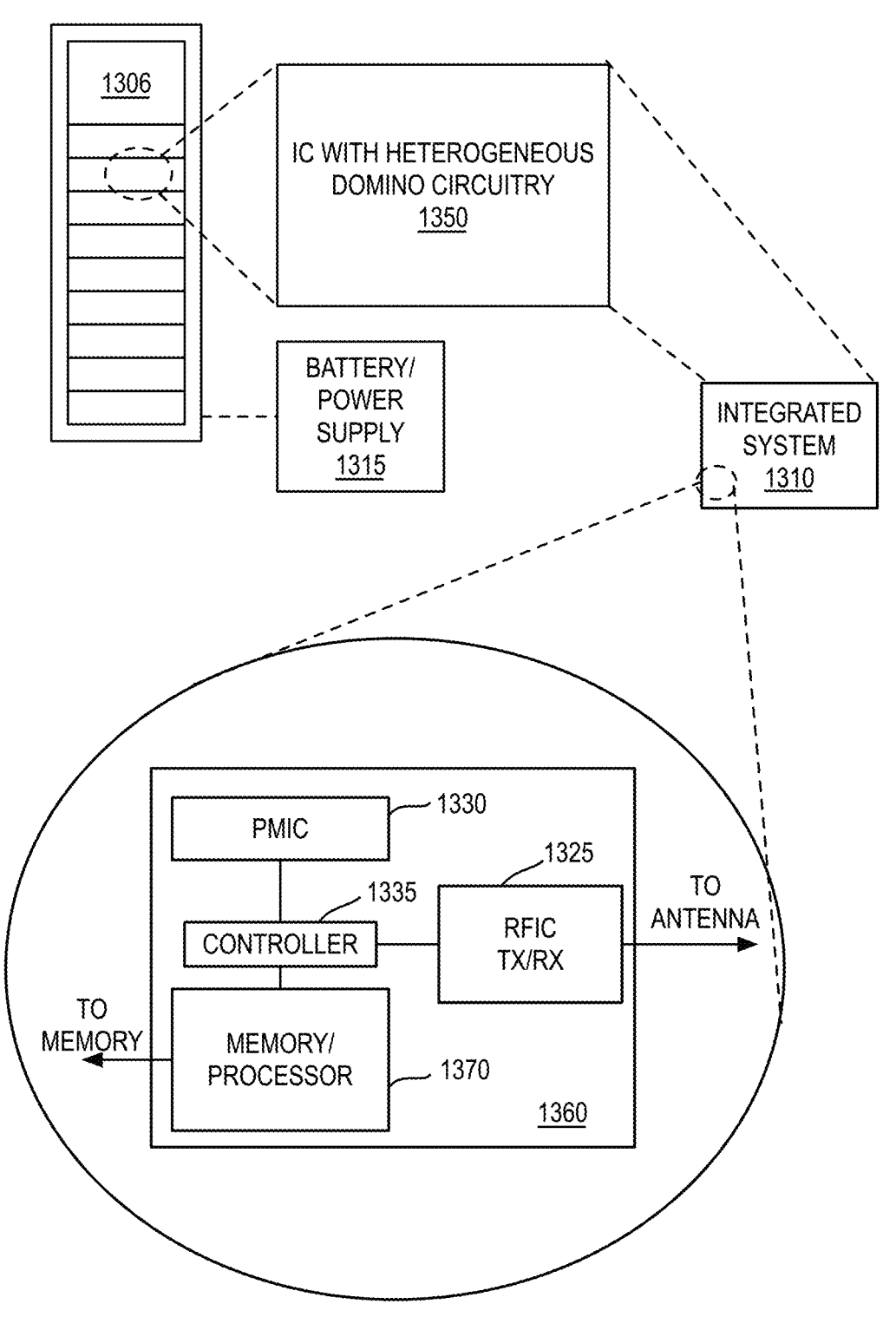
FIG. 13 illustrates a schematic of a data server machine including an actively liquid-phase cooled integrated circuit comprising dynamic logic circuitry with keeper transistors on a backside of the IC die in accordance with some embodiments.

FIG. 13 illustrates a schematic of a data server machine including an actively cooled integrated circuit with transistors comprising heterogeneous domino circuitry having keeper transistors within a second device layer, in accordance with one or more embodiments described elsewhere herein. Server machine 1306 may be any commercial server, for example, including any number of high-performance computing platforms disposed within a rack and networked together for electronic data processing, which in the exemplary embodiment includes one or more devices 1350 having an integrated circuit that includes heterogeneous domino circuitry having keeper transistors within a second device layer.

Also as shown, server machine 1306 includes a battery and/or power supply 1315 to provide power to devices 1350, and to provide, in some embodiments power delivery functions such as power regulation. Devices 1350 may be deployed as part of a package-level integrated system 1310. In the exemplary embodiment, integrated system 1310 includes an integrated circuitry 1370 (labeled "Memory/ Processor") includes at least one memory array (e.g., RAM), and/or at least one processor core (e.g., a microprocessor, a multi-core microprocessor, or graphics processor, or the like) having the characteristics discussed herein. In an embodiment, integrated circuitry 1370 is a microprocessor including an SRAM L1 cache memory. Integrated circuitry 1370 may be further coupled to (e.g., communicatively coupled to) a board, a substrate, or an interposer 1360 along with, one or more of a power management integrated circuit (PMIC) 1330, RF (wireless) integrated circuitry (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335.

Figure 14:
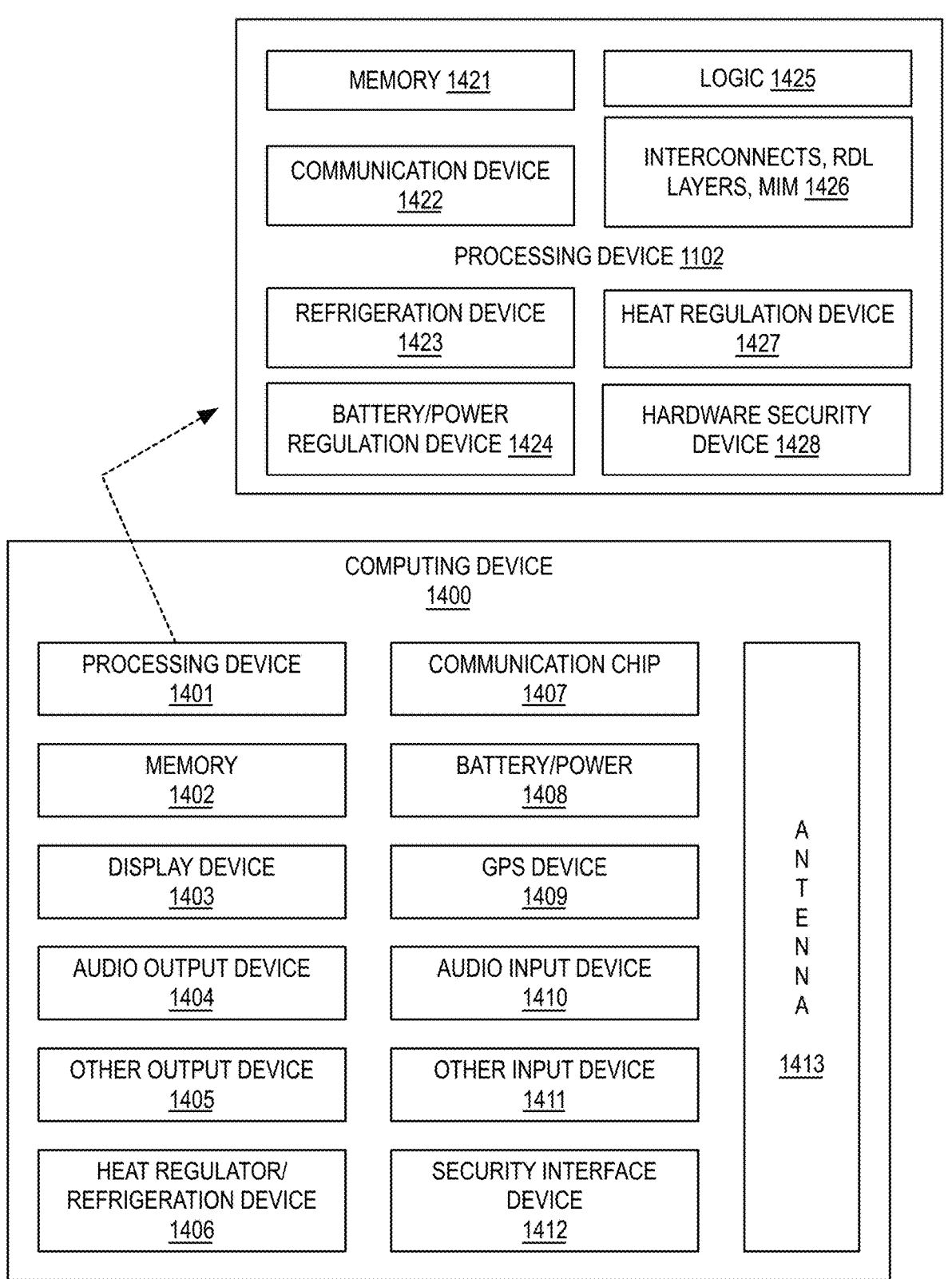
FIG. 14 is a block diagram of a cryogenically cooled computing device in accordance with some embodiments.

FIG. 14 is a block diagram of a cryogenically cooled computing device 1400, in accordance with some embodiments. For example, one or more components of computing device 1400 may include any of the devices or structures discussed elsewhere herein. Components are illustrated in FIG. 14 as included in computing device 1400, but any one or more of these components may be omitted or duplicated, as suitable for the application. In some embodiments, some the components included in computing device 1400 may instead be attached to one or more printed circuit boards (e.g., a motherboard). In some embodiments, various ones of these components may be fabricated onto a single system-on-a-chip (SoC) die. Additionally, in various embodiments, computing device 1400 may not include one or more of the components illustrated in FIG. 14, but computing device 1400 may include interface circuitry for coupling to the one or more components. For example, computing device 1400 may not include a display device 1403, but may include display device interface circuitry (e.g., a connector and driver circuitry) to which display device 1403 may be coupled.

Computing device 1400 may include a processing device 1401 (e.g., one or more processing devices). As used herein, the term processing device or processor indicates a device that processes electronic data from registers and/or memory to transform that electronic data into other electronic data that may be stored in registers and/or memory. Processing device 1401 may include a memory 1421, a communication device 1422, a refrigeration/active cooling device 1423, a battery/power regulation device 1424, logic 1425, interconnects 1426 (i.e., optionally including redistribution layers (RDL) or metal-insulator-metal (MIM) devices), a heat regulation device 1427, and a hardware security device 1428.

Processing device 1401 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 1401 may include a memory 1402, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 1421 includes memory that shares a die with processing device 1401. This memory may be used as cache memory and may include embedded dynamic random access memory (eDRAM) or spin transfer torque magnetic random-access memory (STT-M RAM).

Computing device 1400 may include a heat regulation/ refrigeration device 1406. Heat regulation/refrigeration device 1423 may maintain processing device 1402 (and/or other components of computing device 1400) at a predetermined low temperature during operation. This predetermined low temperature may be any temperature discussed elsewhere herein.

In some embodiments, computing device 1400 may include a communication chip 1407 (e.g., one or more communication chips). For example, the communication chip 1407 may be configured for managing wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a nonsolid medium.

Communication chip 1407 may implement any wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1407 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1407 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1407 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1407 may operate in accordance with other wireless protocols in other embodiments. Computing device 1400 may include an antenna 1413 to facilitate wireless communications and/or to receive other wireless communications (such as AM or FM radio transmissions).

In some embodiments, communication chip 1407 may manage wired communications, such as electrical, optical, or any other suitable communication protocols (e.g., the Ethernet). As noted above, communication chip 1407 may include multiple communication chips. For instance, a first communication chip 1407 may be dedicated to shorter-range wireless communications such as Wi-Fi or Bluetooth, and a second communication chip 1407 may be dedicated to longer-range wireless communications such as GPS, EDGE, GPRS, CDMA, WiMAX, LTE, EV-DO, or others. In some embodiments, a first communication chip 1407 may be dedicated to wireless communications, and a second communication chip 1407 may be dedicated to wired communications.

Computing device 1400 may include battery/power circuitry 1408. Battery/power circuitry 1408 may include one or more energy storage devices (e.g., batteries or capacitors) and/or circuitry for coupling components of computing device 1400 to an energy source separate from computing device 1400 (e.g., AC line power).

Computing device 1400 may include a display device 1403 (or corresponding interface circuitry, as discussed above). Display device 1403 may include any visual indicators, such as a heads-up display, a computer monitor, a projector, a touchscreen display, a liquid crystal display (LCD), a light-emitting diode display, or a flat panel display, for example.

Computing device 1400 may include an audio output device 1404 (or corresponding interface circuitry, as discussed above). Audio output device 1404 may include any device that generates an audible indicator, such as speakers, headsets, or earbuds, for example.

Computing device 1400 may include an audio input device 1410 (or corresponding interface circuitry, as discussed above). Audio input device 1410 may include any device that generates a signal representative of a sound, such as microphones, microphone arrays, or digital instruments (e.g., instruments having a musical instrument digital interface (MIDI) output).

Computing device 1400 may include a global positioning system (GPS) device 1409 (or corresponding interface circuitry, as discussed above). GPS device 1409 may be in communication with a satellite-based system and may receive a location of computing device 1400, as known in the art.

Computing device 1400 may include another output device 1405 (or corresponding interface circuitry, as discussed above). Examples include an audio codec, a video codec, a printer, a wired or wireless transmitter for providing information to other devices, or an additional storage device.

Computing device 1400 may include another input device 1411 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1400 may include a security interface device 1412. Security interface device 1412 may include any device that provides security measures for computing device 1400 such as intrusion detection, biometric validation, security encode or decode, managing access lists, malware detection, or spyware detection, Computing device 1400, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

It will be recognized that embodiments are not limited to the specific examples described, but can be practiced with modification and alteration without departing from the scope of the appended claims. For example, the above embodiments may include specific combinations of features as further provided below.

In first examples, an integrated circuit (IC) die comprises a domino logic circuit block comprising a plurality of first field effect transistor (FET) structures within a first device layer and interconnected by first metallization levels on a first side of the first device layer. The IC die comprising one or more second metallization levels on a second side of the first device layer, opposite the first metallization levels, and a plurality of keeper FET structures coupled to the domino logic circuit block, wherein the keeper FET structures are within a second device layer that is between the first device level and the second metallization levels.

In second examples, for any of the first examples, the second metallization levels are to be coupled to a power supply voltage rail and the keeper FET structures are p-type and powered through the second metallization levels.

In third examples, for any of the second examples the keeper FET structures are coupled to dynamic nodes of the domino logic circuit block and an output capacitance of the keeper FET structures is to charge the nodes from the power supply voltage rail during a time interval of a clocked operational cycle of the domino logic circuit block.

In fourth examples for any of the first through third examples the keeper FET structures comprise a first semiconductor terminal coupled to the power supply rail, a second semiconductor terminal coupled to an individual one of the nodes, and a gate terminal that is coupled to a transient small signal source to switch the keeper transistors between on and off states prior to, or during, the time interval.

In fifth examples, for any of the first through fourth examples all FET structures of the second device level are p-type FET structures and FET structures of first device layer are predominantly n-type FET structures.

In sixth examples, for any of the first through fifth examples the first device layer is on a substrate comprising a monocrystalline material, and an interface layer is between the first and second device layers, the interface layer comprising at least silicon and nitrogen.

In seventh examples, for any of the sixth examples the keeper FET structures are coupled to the nodes of the domino logic circuit block by an interconnect feature that passes through the interface layer and the first substrate.

In eighth examples, for any of the first through seventh examples the IC die comprises a cooling structure to maintain at least the some of the first FET structures at a temperature below −25° C. during operation of the dynamic logic circuit block.

In ninth examples for any of the eighth examples the cooling structure comprises a plurality of microchannels within the IC die, the microchannels to convey a heat transfer liquid that maintains at least some of the first FET structures at a temperature below −70° C. during operation of the IC die.

In tenth examples, a computer system comprises an integrated circuit (IC) die, comprising a domino logic circuit block comprising a plurality of first field effect transistor (FET) structures within a first device layer and interconnected by first metallization levels that are on a first side of the first device layer. The IC die comprises ne or more second metallization levels on a second side of the first device layer, opposite the first metallization levels. The IC die comprises a plurality of keeper FET structures within a second device layer that is between the first device level and the second metallization levels, wherein the keeper FET structures are coupled to the domino logic circuit block. The system comprises a cooling structure to maintain at least some of the first FET structures at a temperature below −25° C. during operation of the IC die and a power supply with a first voltage rail coupled through the second metallization levels to a first terminal of the keeper FET structures. In eleventh examples, for any of the tenth examples the cooling structure comprises at least one of a plurality of first microchannels within the IC die, or a plurality of second microchannels within a package external to the IC die, the first or channels within a package external to the IC die. The first or second microchannels to convey a heat transfer liquid that maintains at least some of the first FET structures at a temperature below −25° C. during operation of the IC die.

In eleventh examples, for any of the tenth examples the cooling structure comprises at least one of a plurality of first microchannels within the IC die, or a plurality of second microchannels within a package external to the IC die, the first or second microchannels to convey a heat transfer liquid that maintains at least some of the first FET structures at a temperature below −25° C. during operation of the IC die.

In twelfth examples, for any of the eleventh examples cooling structure comprises both the first and second microchannels, and the heat transfer liquid is to maintain at least some of the first FET structures at a temperature below −50° C. during operation of the IC die.

In thirteenth examples, for any of the eleventh through twelfth examples an output capacitance of the p-type keeper FET structures are to charge the nodes of the dynamic circuit block from the power supply rail during a time interval of a clocked operational cycle of the domino logic circuit block. Individual ones of the p-type keeper FET structures comprise a first semiconductor terminal coupled to the power supply rail, a second semiconductor terminal coupled to an individual one of the nodes, and a gate terminal coupled to a transient signal source to switch the p-type keeper FETs between on and off states.

In fourteenth examples, for any of the thirteenth examples the second device level consists of p-type FETs, and the first device layer comprises predominantly n-type FETs.

In fifteenth examples, method of fabricating an IC die comprises forming first field effect transistor (FET) structures within a first device layer on first side of a substrate comprising a monocrystalline material. The method comprises forming first metallization levels over a first side of the first device layer that interconnect the first FET structures into a domino logic circuit block. The method comprises transferring a second device layer onto a second side of the substrate. The second device layer comprises a plurality of keeper FET structures that are coupled through the substrate to dynamic nodes of the domino logic circuit block.

In sixteenth examples, for any of the fifteenth examples a first semiconductor terminal of the keeper FET structures is interconnected to second metallization levels over a second side of the second device layer, and wherein the second metallization levels are to be coupled to a power supply voltage rail.

In seventeenth examples, for any of the fifteenth through sixteenth examples the method further comprises forming the second metallization levels after transferring the second device layer onto the substrate.

In eighteenth examples, for any of the fifteenth through seventeen examples the method further comprises forming microchannels within the integrated circuit (IC) die, the microchannels to convey a coolant liquid.

In nineteenth examples, for any of the eighteenth examples the microchannels are formed over a first side of the first metallization levels.

In twentieth examples, for any of the fifteenth through nineteenth examples the method further comprises forming the plurality of keeper FET structures on the device layer prior to transferring the second device layer onto the substrate.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) die, comprising:
a domino logic circuit block comprising a plurality of n-type first field effect transistor (FET) structures within a first device layer and interconnected by first metallization levels on a first side of the first device layer;
one or more second metallization levels on a second side of the first device layer, opposite the first metallization levels, wherein the second metallization levels are to be coupled to a power supply voltage rail;
a plurality of p-type keeper FET structures coupled to dynamic nodes of the domino logic circuit block, wherein the keeper FET structures are within a second device layer that is between the first device layer and the second metallization levels and wherein the keeper FET structures are powered through the second metallization levels and comprise a gate terminal that is coupled to a transient small signal source to switch the keeper FET structures from off to on states and back to the off state within one precharge interval of an operational cycle and an output capacitance of the keeper FET structures is to charge the nodes of the domino logic circuit block during an evaluation interval following the precharge interval; and
further comprising a cooling structure to maintain at least some of the first FET structures at a temperature below −70° C. during operation of the dynamic nodes of the domino logic circuit block.

2. The IC die of claim 1, wherein the keeper FET structures comprise a first semiconductor terminal coupled to the power supply voltage rail, and a second semiconductor terminal coupled to an individual one of the nodes.

3. The IC die of claim 1, wherein all FET structures of the second device layer are p-type FET structures and FET structures of first device layer are predominantly n-type FET structures.

4. The IC die of claim 3, wherein:
the first device layer is on a substrate comprising a monocrystalline material; and
an interface layer is between the first and second device layers, the interface layer comprising at least silicon and nitrogen.

5. The IC die of claim 4, wherein the keeper FET structures are coupled to
the nodes of the domino logic circuit block by an interconnect feature that passes through the interface layer and the substrate.

6. The IC die of claim 1, wherein the cooling structure comprises a plurality of microchannels within the IC die, the microchannels to convey a heat transfer liquid.

* * * * *